(12) United States Patent
Imbert et al.

(10) Patent No.: US 10,710,192 B2
(45) Date of Patent: Jul. 14, 2020

(54) METHOD FOR ADHERING A FIRST STRUCTURE AND A SECOND STRUCTURE

(71) Applicant: COMMISSARIAT À L'ENERGIE ATOMIQUE ET AUX ENERGIES ALTERNATIVES, Paris (FR)

(72) Inventors: Bruno Imbert, Grenoble (FR); Lamine Benaissa, Grenoble (FR); Paul Gondcharton, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 163 days.

(21) Appl. No.: 15/574,085

(22) PCT Filed: May 13, 2016

(86) PCT No.: PCT/FR2016/051148
§ 371 (c)(1),
(2) Date: Nov. 14, 2017

(87) PCT Pub. No.: WO2016/181090
PCT Pub. Date: Nov. 17, 2016

(65) Prior Publication Data
US 2018/0297143 A1  Oct. 18, 2018

(30) Foreign Application Priority Data

May 13, 2015 (FR) ..................................... 15 54340

(51) Int. Cl.
*B23K 20/02* (2006.01)
*H01L 21/18* (2006.01)
(Continued)

(52) U.S. Cl.
CPC ................ *B23K 20/02* (2013.01); *C22F 1/18* (2013.01); *H01L 21/187* (2013.01); *H01L 24/83* (2013.01);
(Continued)

(58) Field of Classification Search
None
See application file for complete search history.

(56) References Cited

U.S. PATENT DOCUMENTS 6,210,994 B1 * 4/2001 Calegari ............. H01L 23/3171
257/E23.002
6,455,398 B1 * 9/2002 Fonstad, Jr. ......... G02B 6/1245
257/E21.088
(Continued)

FOREIGN PATENT DOCUMENTS

FR    3 006 236 A1    12/2014
FR    3 009 428 A1    2/2015

OTHER PUBLICATIONS

L. Di Cioccio et al., Vertical Metal Interconnect Thanks to Tungsten Direct Bonding, ECTC Conf. Proc., 5490643, pp. 1359-1363 (2010) (Year: 2010).*

(Continued)

*Primary Examiner* — Colleen P Dunn
*Assistant Examiner* — Michael J Kachmarik
(74) *Attorney, Agent, or Firm* — Oliff PLC

(57) ABSTRACT

A method includes steps a) providing the first structure successively including a first substrate, a first layer made from a metal base and a first metal-based metal oxide, b) providing the second structure successively including a second substrate, a second layer made from a second material and a second metal-based metal oxide, the first and second metal oxides presenting a standard free enthalpy of formation ΔG°, the second material being chosen so that it (Continued)

has an oxide presenting a standard free enthalpy of formation strictly less than $\Delta G°$, c) bonding the first structure and second structure by direct adhesion, d) activating diffusion of the oxygen atoms of the first and second metal oxides to the second layer so as to form the oxide of the second material.

11 Claims, 2 Drawing Sheets

(51) Int. Cl.
    *H01L 23/00*     (2006.01)
    *C22F 1/18*     (2006.01)
    *B23K 103/00*     (2006.01)
    *B23K 101/42*     (2006.01)
    *B23K 103/08*     (2006.01)

(52) U.S. Cl.
    CPC ...... *B23K 2101/42* (2018.08); *B23K 2103/08* (2018.08); *B23K 2103/50* (2018.08); *H01L 2224/83896* (2013.01); *H01L 2224/83948* (2013.01)

(56) References Cited

U.S. PATENT DOCUMENTS

| | | | |
|---|---|---|---|
| 2014/0073112 A1 | 3/2014 | Plach et al. | |
| 2015/0243611 A1* | 8/2015 | Liu | H01L 24/06 |
| | | | 257/751 |
| 2016/0009550 A1* | 1/2016 | Chien | B81C 1/00269 |
| | | | 438/51 |

OTHER PUBLICATIONS

L. Di Cioccio et al, Modeling and integration phenomena of metal-metal direct bonding technology, ECS Transactions, 2014 (Year: 2014).*

Shigetou et al., "Modified Diffusion Bonding for Both Cu and SiO2 at 150° C. in Ambient Air," Electronic Components and Technology Conference, IEEE, 2010, pp. 872-877.

Shimatsu et al., "Atomic diffusion bonding of wafers with thin nanocrystalline metal films," J. Vac. Sci. Technol. B, Jul.-Aug. 2010, vol. 28, No. 4, pp. 706-714.

Gondcharton et al., "Mechanisms overview of Thermocompression Process for Copper Metal Bonding," MRS Online Proc. Libr., 2013, vol. 1559.

Di Cioccio et al., "Modeling and integration phenomena of metal-metal direct bonding technology," ECS Trans., 2014, vol. 64, No. 5, pp. 1-17.

* cited by examiner

METHOD FOR ADHERING A FIRST STRUCTURE AND A SECOND STRUCTURE

FIELD OF THE INVENTION

The present invention relates to a method of bonding a first structure and a second structure, the first structure and the second structure both comprising at least one metal layer.

What is meant by "metal layer" is a layer made from a metal base (pure metal or metal alloy) or a metal oxide base.

Bonding of such structures is in particular used in microelectronics in order to stack components. The following fields of application can be cited for non-exhaustive example purposes:
- fabrication of 3D integrated circuits by sequential or monolithic 3D integration,
- fabrication of optic, photovoltaic, or power components,
- packaging of micro electromechanical systems (MEMS).

Depending on the nature of the first and second structures, the bonding can be of the following type:
- Wafer-to-Wafer (WtW),
- Die-to-Die (DtD),
- Die-to-Wafer (DtW).

A first bonding method known from the state of the art, in particular from the documents A. Shigetou et al., "Modified diffusion bonding for both Cu and $SiO_2$ at 150° C. in ambient air", ECTC Proceedings 60th, 2010, pp. 872-877 and T. Shimatsu et al., "Atomic diffusion bonding of wafers with thin nanocrystalline metal films", J. Vac. Sci. Technol. B Microelectron. Nanometer Struct., vol. 28, no. 4, 2010, pp. 706-714, comprises bonding the first and second structures by direct bonding of the metal layers, the metal layers being formed by a metal base. Such a first state-of-the-art method is performed in an ultra-high vacuum (i.e. in an atmosphere presenting a pressure conventionally lower than $10^{-7}$ Pa) in a dedicated chamber in order to prevent the formation of a native metal oxide at the surface of said metal layers. Such a first state-of-the-art method is not entirely satisfactory on account of the high cost of a chamber dedicated to formation of an ultra-high vacuum.

A second bonding method known from the state of the art, in particular from the document P. Gondcharton et al, "Mechanisms overview of thermocompression process for copper metal bonding", MRS Online Proc. Libr., vol. 1559, 2013, comprises bonding the first and second structures by thermocompression of the metal layers, each metal layer successively comprising a metal-based layer and a metal oxide-based layer. The metal oxide is conventionally a native oxide. Such a second method, being performed in temperature, enables the metal oxides between the metal-based layers to be eliminated. This thermal budget results in closing of the bonding interface, but presents a long process time (most of the time a single bonding by thermocompression), which is therefore more costly.

A third bonding method known from the state of the art, in particular from the document L. Di Cioccio et al., "Modeling and integration phenomena of metal-metal direct bonding technology", ECS Trans., vol. 64, no. 5, 2014, pp. 339-355, comprises bonding the first and second structures by direct bonding of the metal layers, each metal layer successively comprising a metal-based layer and a metal oxide-based layer. The metal oxide is conventionally a native oxide. Such a third method previously comprises a Chemical Mechanical Polishing (CMP) step in order to smooth and activate the surface of the metal oxide-based layers. Such a third method is followed by a thermal anneal designed to enhance the oxygen depletion of the bonding interface. In the case of a bonding structure using the $Cu/CuO_x$ pair, it enables dissolution of the metal oxide starting from 200° C., and thereby a conducting electric contact. For another metal/oxide pair such as $Ti/TiO_x$, the electric conduction of the bonding interface can be increased as from 200° C.-300° C. by the capacity of Ti to solubilize oxygen in its matrix. In this publication, the case of bonding tungsten with its native oxide is referenced. This oxide is present at the bonding interface up to more than 600° C., a temperature which is high for producing microelectronics components. Depending on the materials used, the oxygen depletion kinetics can therefore be slow.

OBJECT OF THE INVENTION

The object of the present invention is therefore to totally or partially remedy the above-mentioned shortcomings, and relates for this purpose to a method of bonding a first structure and a second structure, comprising the following steps:

a) providing the first structure successively comprising a first substrate, a first layer made from a first material based on a metal, and a first metal oxide based on the metal, b) providing the second structure successively comprising a second substrate, a second layer made from a second material, and a second metal oxide based on the metal, the second metal oxide being in direct contact with the second layer, the first and second metal oxides presenting a standard free enthalpy of formation from the metal, noted $\Delta G°$, the second material being chosen so that it has an oxide presenting a standard free enthalpy of formation from the second material strictly lower than $\Delta G°$, c) bonding the first structure and the second structure by direct adhesion between the first metal oxide and the second metal oxide, d) activating diffusion of the oxygen atoms of the first and second metal oxides to the second layer so as to form the oxide of the second material in all or part of the thickness of the second layer.

Such a method according to the invention thus enables the electric conduction of the bonding interface to be significantly improved relatively to the state of the art by depleting the oxygen content of the first and second metal oxides in step d), while at the same time preserving the integrity of the bonding interface. Furthermore, such a method enables control of the water trapped at the bonding interface so as to prevent the formation of an oxide at the level of this interface. Furthermore, the first and second metal oxides whose oxygen was depleted in step d) present an electric conductivity close to that of the metal, which enables an electrically conducting bonding interface to be formed, which may be advantageous for certain applications requiring vertical interconnections. The first and second metal oxides are furthermore made from the same metal base and enable a symmetrical bonding to be obtained in step c), thereby contributing to the good quality of the bonding interface.

The second material is chosen such that it has an oxide presenting a standard free enthalpy of formation from the second material strictly lower than $\Delta G°$. In other words, this necessary condition expresses the fact that the second material is an oxygen acceptor with a reducing power on the first and second metal oxides. The second material is therefore necessarily chosen different from the first material. This results in the second metal oxide, which is an oxide of the metal of the first material, not being able to be a native oxide of the second material.

The fact that the second metal oxide is in direct contact with the second layer prevents the presence of a diffusion barrier of the oxygen atoms placed between the second layer and the second metal oxide.

The oxide of the second material is formed in all or part of the thickness of the second layer depending on the oxygen depletion level required in the first and second metal oxides, and depending on the value of the initial thickness of the second layer in step b).

The bonding of step c) is performed by direct adhesion. What is meant by "direct adhesion" is a bonding achieved by placing two surfaces in direct contact, i.e. in the absence of an additional element such as a glue, a wax or a braze. The adhesion mainly results from the Van der Waals forces originating from the electronic interaction between the atoms or molecules of the two surfaces. This is also called molecular adhesion bonding.

In one embodiment, step b) comprises a step b1) consisting of forming metallic bumps in the whole thickness of the second layer.

Such metallic bumps thus ensure an electric conductivity through the second layer, in spite of the formation of the oxide of the second material in step d), which is conventionally an electric insulator. This is particularly advantageous for certain applications requiring vertical interconnections.

The second metal oxide presents a part situated facing each metallic bump. The metallic bumps are advantageously dimensioned so that the oxygen atoms of the part of the second metal oxide can diffuse to the second layer on each side of the corresponding metallic bump. Each metallic bump advantageously presents a width comprised between 10 nm and 100 nm. Each metallic bump extends in a longitudinal direction parallel to the plane defined by the second substrate. What is meant by "width" is a dimension in a direction perpendicular to the longitudinal direction and parallel to the plane defined by the second substrate.

According to one form of execution, the first structure and the second structure bonded in step c) form an assembly, and step d) is executed by applying a thermal anneal to the assembly.

Such a thermal anneal thus presents a suitable thermal budget to enable both:
oxygen atoms to be made to diffuse from the first and second metal oxides to the second layer so as to form the oxide of the second material in all or part of the thickness of the second layer,
and the bonding interface to be strengthened.

What is meant by a "thermal budget" is an annealing temperature and an annealing time.

According to a variation of execution, step d) is executed by applying a potential difference between the first and second substrates.

In this case, the first and second substrates have to be sufficiently conductive (metallic or strongly doped substrates). The potential difference applied between the first and second substrates is adjusted to make oxygen atoms diffuse from the first and second metal oxides to the second layer so as to form the oxide of the second material in all or part of the thickness of the second layer.

Step d) is then advantageously followed by a step e) of applying a thermal anneal to the assembly formed by the bonded first and second structures. Such a thermal anneal presents a suitable thermal budget to strengthen the bonding interface. Such a thermal budget is reduced relatively to the thermal budget necessary to make oxygen atoms diffuse from the first and second metal oxides to the second layer so as to form the oxide of the second material in all or part of the thickness of the second layer.

According to one embodiment, step a) comprises a step a1) consisting of forming the first metal oxide on the first layer in controlled manner and step b) comprises a step b2) consisting of forming the second metal oxide on the second layer in controlled manner.

The first metal oxide is therefore not a native oxide which forms in spontaneous manner in an oxidizing atmosphere. It is then possible to control in particular the thickness and stoichiometry of the first metal oxide. Likewise, as specified in the foregoing, the second metal oxide is not a native oxide of the second material either, in so far as the second material is necessarily chosen different from the first material, and the second metal oxide is made from a base formed by the metal of the first material. Such first and second metal oxides therefore enable the quality of the bonding interface to be improved.

According to one form of execution, steps a1) and b2) are executed by a technique selected from the group comprising physical vapor deposition, chemical vapor deposition, and thermal oxidation.

According to one embodiment:
the first material is tungsten-based,
the first and second metal oxides are based on $WO_x$, x being comprised between 1 and 4,
the second material is silicon-based, preferably amorphous silicon-based,
the oxide of the second material is based on an oxidized silicon phase.

$WO_x$ is preferably tungsten dioxide $WO_2$ or tungsten trioxide $WO_3$. The oxidized silicon phase is preferably silicon dioxide.

Thus, if the standard free enthalpy of formation of $WO_x$ from the tungsten metal W is noted $\Delta G°$, x being comprised between 1 and 4 (for example tungsten dioxide $WO_2$ or tungsten trioxide $WO_3$), the silicon-based (or amorphous silicon-based) second material is chosen as it has an oxidized phase, for example silicon dioxide, presenting a standard free enthalpy of formation from the silicon (or amorphous silicon) strictly lower than $\Delta G°$, the difference being about 300 kJ/mol between 298 K and 1000 K.

Advantageously, the thermal anneal presents:
an annealing temperature comprised between 100° C. and 600° C., preferably comprised between 350° C. and 550° C.
an anneal time of more than 30 min, preferably more than 1 h.

Such a thermal budget thus both enables:
oxygen atoms of $WO_x$, x being comprised between 1 and 4 (for example tungsten dioxide $WO_2$ or tungsten trioxide $WO_3$), to be made to diffuse to the silicon-based or amorphous silicon-based second layer so as to form an oxidized silicon phase in all or part of the thickness of the second layer,
and closing of the bonding interface to be strengthened.

Furthermore, amorphous silicon is particularly advantageous in so far as it has been experimentally observed that it enhanced oxygen depletion of tungsten dioxide $WO_2$ or tungsten trioxide $WO_3$ relatively to monocrystalline silicon.

The second material is advantageously chosen so that it has an oxide presenting a standard free enthalpy of formation from the second material strictly lower than $\Delta G°$ at least at the temperature (or at least over the temperature range) at which step d) is executed.

The oxygen depletion of the first and second metal oxides is thus enhanced.

BRIEF DESCRIPTION OF THE DRAWINGS

Other features and advantages will become apparent from the following description of particular embodiments of the invention given for non-restrictive example purposes only, with reference to the appended drawings in which.

DESCRIPTION OF PREFERENTIAL EMBODIMENTS OF THE INVENTION

Figure 1:
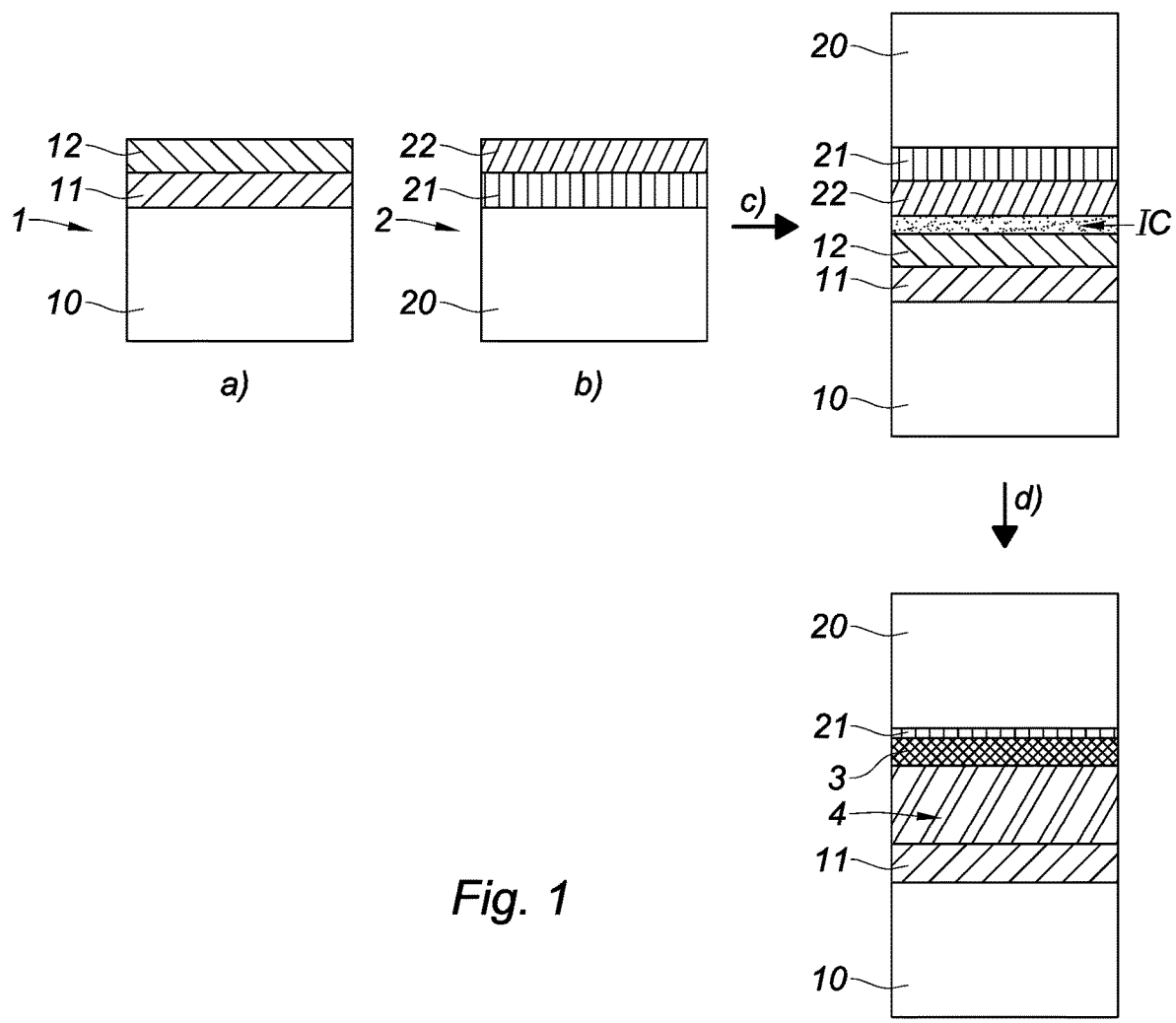
FIG. 1 is a schematic cross-sectional view illustrating the different steps of a method of the invention according to a first embodiment.

For the different embodiments, the same reference numerals will be used for identical parts or parts performing the same function, for the sake of simplification of the description. The technical characteristics described in the following for different embodiments are to be considered either alone or in any technically possible combination.

Figure 2:
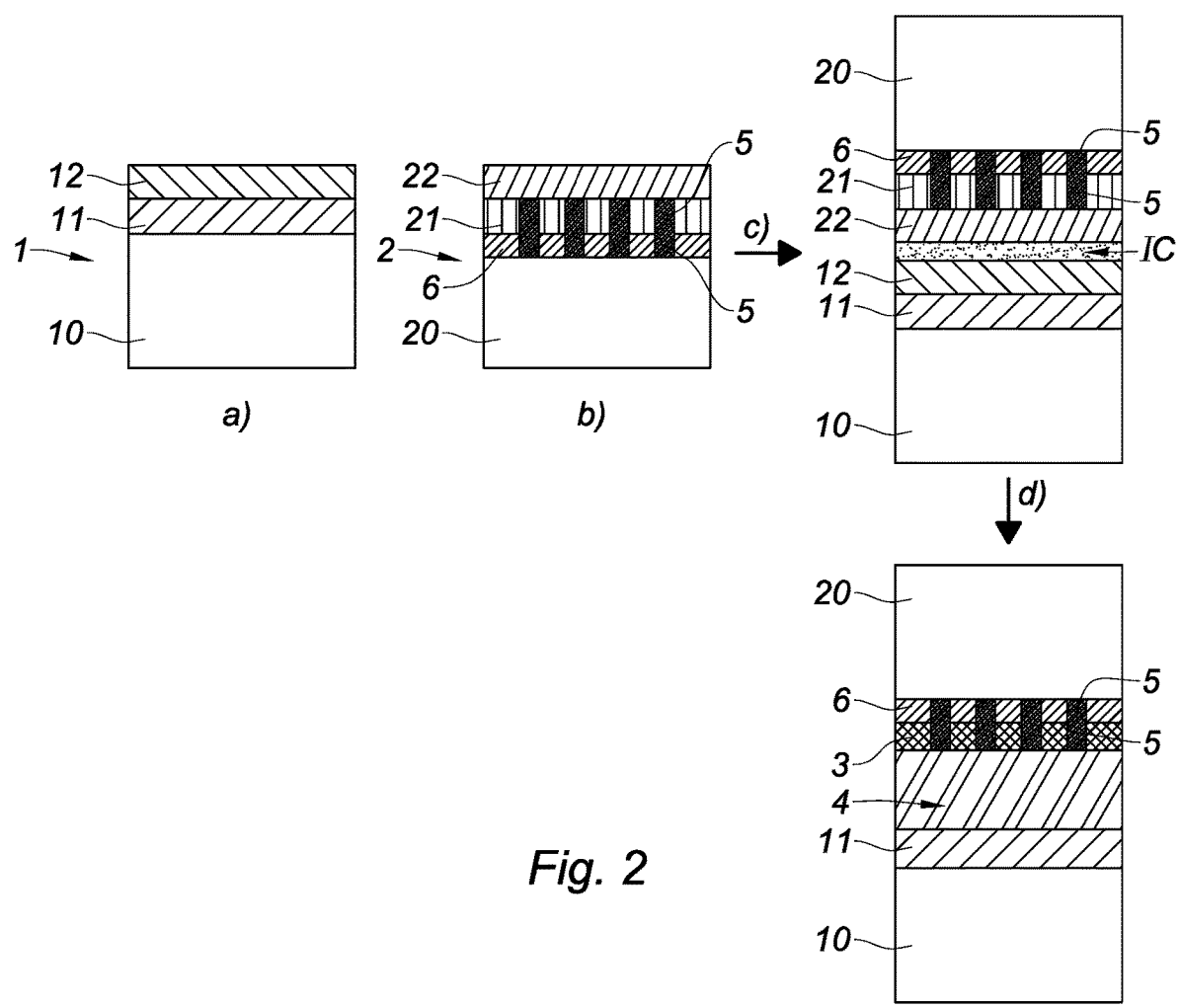
FIG. 2 is a schematic cross-sectional view illustrating the different steps of a method of the invention according to a second embodiment.

The method illustrated in FIGS. 1 and 2 is a method of bonding a first structure 1 and a second structure 2, comprising the following steps:

a) providing the first structure 1 successively comprising a first substrate 10, a first layer 11 made from a first material based on a metal, and a first metal oxide 12 based on the metal, b) providing the second structure 2 successively comprising a second substrate 20, a second layer 21 made from a second material, and a second metal oxide 22 based on the metal, the second metal oxide 22 being in direct contact with the second layer 21, the first and second metal oxides 12, 22 presenting a standard free enthalpy of formation from the metal, noted $\Delta G°$, the second material being chosen so that it has an oxide 3 presenting a standard free enthalpy of formation from the second material strictly lower than $\Delta G°$, c) bonding the first structure 1 and the second structure 2 by direct adhesion between the first metal oxide 12 and the second metal oxide 22, d) activating diffusion of the oxygen atoms of the first and second metal oxides 12, 22 to the second layer 21 so as to form the oxide 3 of the second material in all or part of the thickness of the second layer 21.

Step a) advantageously comprises the following steps:
a0) providing the first substrate 10,
a01) forming the first layer 11 on the first substrate 10,
a02) forming the first metal oxide 12 on the first layer 11.

Steps a01) and a02) are advantageously executed in the same chamber in order to prevent the formation of a native oxide on the first layer 11. Step a) advantageously comprises a step a1) consisting of forming the first metal oxide 12 on the first layer 11 in controlled manner. Step a1) is advantageously executed by a technique selected from the group comprising physical vapor deposition, chemical vapor deposition, and thermal oxidation.

Step b) advantageously comprises the following steps:
b0) providing the second substrate 20,
b01) forming the second layer 21 on the second substrate 20,
b02) forming the second metal oxide 22 on the second layer 21 in direct contact.

Steps b01) and b02) are advantageously executed in the same chamber in order to prevent the formation of a native oxide of the second material between the second layer 21 and the second metal oxide 22. Step b) advantageously comprises a step b2) consisting of forming the second metal oxide 22 on the second layer 21 in controlled manner. Step b2) is advantageously executed by a technique selected from the group comprising physical vapor deposition, chemical vapor deposition.

The first and second substrates 10, 20 advantageously present a surface roughness of less than 1 nm root mean square (RMS) on a 20×20 µm$^2$ scan evaluated by an atomic force microscope (AFM). The first and second substrates 10, 20 are advantageously made from a material selected from the group comprising a metal, a semiconductor, or a ceramic.

Figure 3:
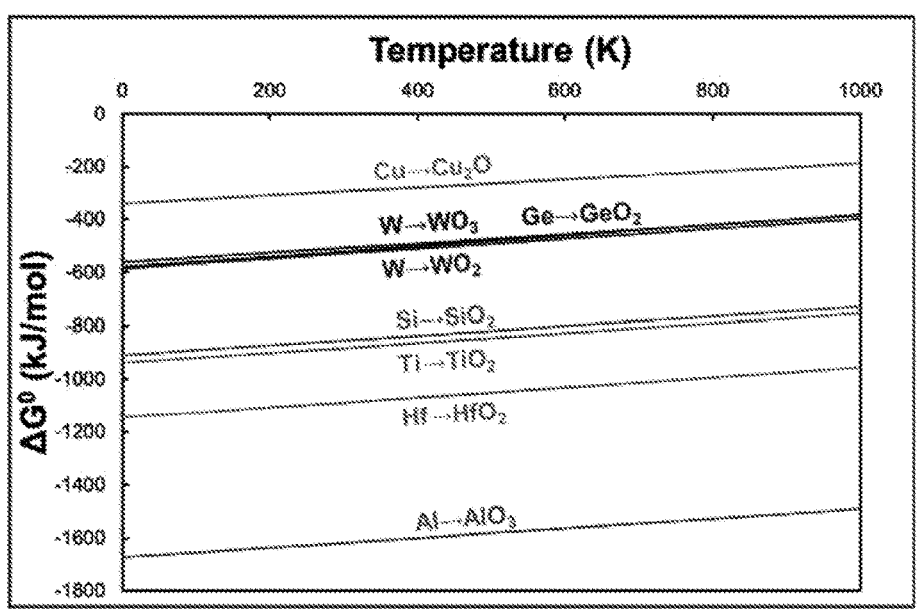
FIG. 3 is an Ellingham diagram representing the standard free enthalpy of formation of an oxide (in kJ/mol) from metals or semiconductors versus the temperature (in K).

The choice of the second material is advantageously made by consulting an Ellingham diagram as illustrated in FIG. 3. $\Delta G°$ is thus materialized by a first line. The standard free enthalpy of formation of the oxide 3 from the second material is materialized by a second line. The second material is chosen so that the second line is located underneath the first line in the Ellingham diagram.

Execution of step c) leads to the formation of a bonding interface IC comprising water molecules provided by the atmosphere in which step c) is executed. The bonding can for example be performed in air, at atmospheric pressure and at ambient temperature.

Execution of step d) leads to:
formation of an electrically conductive area 4 resulting from the oxygen depletion of the first and second metal oxides 12, 22,
formation of the oxide 3 of the second material in all or part of the thickness of the second layer 21.

The first structure 1 and second structure 2 bonded in step c) form an assembly 1, 2, and step d) is advantageously executed by applying a thermal anneal to the assembly 1, 2.

According to a first embodiment:
the first material is made from tungsten, the first layer 11 preferably presenting a thickness of 20 nm,
the first and second metal oxides 12, 22 are made from tungsten dioxide $WO_2$ or from tungsten trioxide $WO_3$, the first and second metal oxides preferably presenting a thickness of 10 nm,
the second material is made from silicon, preferably from amorphous silicon, the second layer 21 preferably presenting a thickness of 10 nm,
the oxide 3 of the second material originates from an oxidized silicon phase, for example silicon dioxide.

What is meant by "thickness" is a dimension perpendicular to the plane defined by a substrate 10, 20.

As illustrated in FIG. 3, the second material which is formed by silicon (monocrystalline or polycrystalline or amorphous silicon) is chosen so that it has an oxide, silicon dioxide, presenting a standard free enthalpy of formation from (monocrystalline or amorphous) silicon strictly less than $\Delta G°$ of the $W/WO_2$ pair or of the $W/WO_3$ pair.

The first and second substrates 10, 20 are advantageously made from a silicon-based material.

Steps a01), a02) and b02) are advantageously executed in a cathode sputtering chamber under reactive plasma at ambient temperature, i.e. between 20° C. and 30° C. Steps a02) and b02) are advantageously executed in a plasma containing dioxygen. The first and second metal oxides 12, 22 formed in steps a02) and b02) present a resistivity comprised between $5*10^{-2}$ and $5*10^{-3}$ $\Omega\cdot cm^{-1}$.

Step c) is executed at ambient atmosphere, i.e. with a pressure of about 1013.25 hPa and a relative humidity of 40% of water, and at ambient temperature, i.e. comprised between 20° C. and 30° C.

When step d) is executed, the thermal anneal applied to the assembly 1, 2 presents:
- an annealing temperature comprised between 100° C. and 600° C., preferably comprised between 350° C. and 550° C., more preferentially comprised between 450° C. and 550° C.,
- an annealing time of more than 30 min, preferably more than 1 h, more preferentially more than 2 h.

The thermal annealing is advantageously applied in an inert, non-oxidizing atmosphere, i.e. in an $N_2$ or Ar atmosphere or in a vacuum.

It was experimentally observed by transmission electron microscope that:
- the bonding interface IC is no longer visible after step d),
- the oxide 3 has been formed in the thickness of the second layer 21.

As illustrated in FIG. 2, step b) advantageously comprises a step b1) of forming metallic bumps 5 in the whole thickness of the second layer 21. The second substrate 20 is advantageously covered by a dielectric layer 6. The metallic bumps 5 advantageously extend over the whole thickness of the dielectric layer 6 so as to form for example a CMOS interconnection layer. The dielectric layer 6 is advantageously made from an identical material to the oxide 3 of the second material in order to homogenize the electric insulation of the metallic bumps 5.

The second metal oxide 22 presents a part situated facing each metallic bump 5. The metallic bumps 5 are advantageously dimensioned so that the oxygen atoms of said part of the second metal oxide 22 can diffuse to the second layer 21 on each side of the corresponding metallic bump 5. Each metallic bump 5 advantageously presents a width comprised between 10 nm and 100 nm. Each metallic bump 5 extends in a longitudinal direction parallel to the plane defined by the second substrate 20. What is meant by "width" is a dimension in a direction perpendicular to the longitudinal direction and parallel to the plane defined by the second substrate 20.

Such a method thereby enables monolithic 3D integration of a stack of transistors.

The invention claimed is:

1. A method of bonding a first structure with a second structure, the method comprising:
   a) providing the first structure successively comprising:
      a first substrate,
      a first layer made from a first material based on tungsten, and
      a first oxide based on tungsten with 1-4 oxygen atoms,
   b) providing the second structure successively comprising:
      a second substrate,
      a second layer made from a second material based on silicon, and
      a second oxide based on tungsten with 1-4 oxygen atoms, the second oxide being in direct contact with the second layer,
   wherein step b) comprises directly depositing the second oxide on the second layer,
   c) bonding the first structure with the second structure by direct adhesion between the first oxide and the second oxide, and
   d) activating diffusion of the oxygen atoms of the first and second oxides to the second layer so as to form the oxide of the second material in all or part of the thickness of the second layer.

2. The method according to claim 1, wherein step b) comprises a step b1) consisting of forming metallic bumps in the whole thickness of the second layer.

3. The method according to claim 1, wherein the first structure and the second structure bonded in step c) form an assembly, and wherein step d) is executed by applying a thermal anneal to the assembly.

4. The method according to claim 1, wherein step d) is executed by applying a potential difference between the first and second substrates.

5. The method according to claim 1, wherein step a) comprises directly depositing the first oxide on the first layer.

6. The method according to claim 1, wherein the second oxide is directly deposited on the second layer by a technique selected from the group consisting of physical vapor deposition, chemical vapor deposition, and thermal oxidation.

7. The method according to claim 3,
   wherein the thermal anneal presents:
      an annealing temperature comprised between 100° C. and 600° C.,
      an annealing time of more than 30 min.

8. The method according to claim 1, wherein the second material is amorphous silicon-based.

9. The method according to claim 7, wherein the annealing temperature is between 350° C. and 550° C.

10. The method according to claim 7, wherein the annealing time is more than 1 hour.

11. The method according to claim 5, wherein the first oxide is directly deposited on the first layer by a technique selected from the group consisting of physical vapor deposition, chemical vapor deposition, and thermal oxidation.

* * * * *